(12) United States Patent
Nishimura et al.

(10) Patent No.: US 9,905,748 B2
(45) Date of Patent: Feb. 27, 2018

(54) VIBRATING DEVICE

(71) Applicant: Murata Manufacturing Co., Ltd., Nagaokakyo-shi, Kyoto-fu (JP)

(72) Inventors: Toshio Nishimura, Nagaokakyo (JP); Keiichi Umeda, Nagaokakyo (JP); Takashi Hase, Nagaokakyo (JP); Keisuke Takeyama, Nagaokakyo (JP); Takehiko Kishi, Nagaokakyo (JP); Hiroshi Yamada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 340 days.

(21) Appl. No.: 14/939,270

(22) Filed: Nov. 12, 2015

(65) Prior Publication Data

US 2016/0064642 A1    Mar. 3, 2016

Related U.S. Application Data

(63) Continuation of application No. PCT/JP2014/062078, filed on May 1, 2014.

(30) Foreign Application Priority Data

May 13, 2013   (JP) ................................. 2013-101301

(51) Int. Cl.
*H03H 9/02*   (2006.01)
*H01L 41/09*  (2006.01)
(Continued)

(52) U.S. Cl.
CPC ............ *H01L 41/09* (2013.01); *H01L 41/047* (2013.01); *H01L 41/083* (2013.01);
(Continued)

(58) Field of Classification Search
CPC ............. H03H 9/02448; H03H 9/0595; H03H 9/2452; H01L 41/047; H01L 41/09; H01L 41/083
(Continued)

(56) References Cited

U.S. PATENT DOCUMENTS 9,590,587 B1 * 3/2017 Thalmayr .............. H03H 9/059
2003/0184397 A1 10/2003 Takahashi et al.
2010/0013360 A1 1/2010 Baborowski et al.

FOREIGN PATENT DOCUMENTS

JP   H07-226648 A   8/1995
JP   H08-186467 A   7/1996
(Continued)

OTHER PUBLICATIONS

International Search Report issued for PCT/JP2014/062078, dated Jul. 8, 2014.
(Continued)

*Primary Examiner* — Derek Rosenau
(74) *Attorney, Agent, or Firm* — Arent Fox LLP

(57) ABSTRACT

A vibrating device that is in the form of a rectangular plate having opposed long sides and opposed short sides, and that utilizes an expanding and contracting vibration mode in a direction of the short sides. The vibrating device includes a Si layer made of a degenerate semiconductor, a silicon oxide layer, a piezoelectric layer, and first and second electrodes through which a voltage is applied to the piezoelectric layer. When a total thickness of the Si layer is denoted by T1, a total thickness of the silicon oxide layer is denoted by T2, and the TCF in the vibrating device when the silicon oxide layer 3 is not provided is denoted by x(ppm/K), T2/(T1+T2) is within a range of $(-0.0003x^2-0.0256x+0.0008)\pm0.05$.

20 Claims, 7 Drawing Sheets

(51) Int. Cl.
    *H03H 9/05*         (2006.01)
    *H03H 9/24*         (2006.01)
    *H01L 41/047*     (2006.01)
    *H01L 41/083*     (2006.01)
    *H03H 9/15*         (2006.01)

(52) U.S. Cl.
    CPC ...... *H03H 9/02448* (2013.01); *H03H 9/0595* (2013.01); *H03H 9/2452* (2013.01); *H03H 2009/155* (2013.01)

(58) Field of Classification Search
    USPC ................................................ 310/320, 321
    See application file for complete search history.

(56) References Cited

FOREIGN PATENT DOCUMENTS

| | | |
|---|---|---|
| JP | 2001-188675 A | 6/2001 |
| JP | 2003-289236 A | 10/2003 |
| JP | 2004-080468 A | 3/2004 |
| WO | WO 2008/043727 A1 | 4/2008 |
| WO | WO 2010/062647 A2 | 6/2010 |
| WO | WO 2012/110708 A1 | 8/2012 |
| WO | WO 2012/156585 A1 | 11/2012 |

OTHER PUBLICATIONS

Written Opinion of the International Searching Authority issued for PCT/JP2014/062078, dated Jul. 8, 2014.

\* cited by examiner

VIBRATING DEVICE

CROSS REFERENCE TO RELATED APPLICATIONS

The present application is a continuation of International application No. PCT/JP2014/062078 filed May 1, 2014, which claims priority to Japanese Patent Application No. 2013-101301, filed May 13, 2013, the entire contents of each of which are incorporated herein by reference.

FIELD OF THE INVENTION

The present invention relates to a vibrating device including a plurality of tuning fork arms, and more particularly to an MEMS vibrating device.

BACKGROUND OF THE INVENTION

An MEMS (Micro Electro Mechanical Systems) structure is so far known in which an excitation portion including a piezoelectric thin film is constituted on a Si semiconductor layer. Various trials have been made to improve the temperature coefficient of resonant frequency (TCF) in a vibrator with the MEMS structure. Patent Document 1, given below, discloses a method of reducing an absolute value of the TCF by laminating Si and $SiO_2$. Patent Documents 2 and 3, given below, disclose a method of reducing the primary temperature coefficient of resonant frequency of Si itself by doping a p-type or n-type dopant into Si.

Patent Document 4, given below, discloses a method of using a $Si/SiO_2$ combined material and doping Si at a high concentration. Patent Document 4 states that the secondary temperature coefficient of resonant frequency can be reduced.

Patent Document 1: WO2008/043727
Patent Document 2: WO2010/062847
Patent Document 3: WO2012/110708
Patent Document 4: WO2012/156585

SUMMARY OF THE INVENTION

Various methods for reducing the absolute value of the TCF in the vibrator with the MEMS structure have been proposed as disclosed in Patent Documents 1 to 4. However, those disclosed methods still have a difficulty in sufficiently reducing the absolute value of the TCF.

An object of the present invention is to provide a vibrating device capable of sufficiently reducing an absolute value of the temperature coefficient of resonant frequency (TCF).

A vibrating device according to a first invention of this application is in the form of a rectangular plate having long sides and short sides when looked at in a plan view, and the vibrating device causes expanding and contracting vibration in a direction of the short sides.

The vibrating device according to the first invention includes a Si layer made of a degenerate semiconductor, a silicon oxide layer, a piezoelectric layer, and first and second electrodes through which a voltage is applied to the piezoelectric layer. Given that a total thickness of the Si layer is denoted by T1, a total thickness of the silicon oxide layer is denoted by T2, and the TCF in the vibrating device when the silicon oxide layer is not provided is denoted by x (ppm/K), T2/(T1+T2) is within a range of $(-0.0003x^2-0.0256x+0.0008)\pm0.05$.

A vibrating device according to a second invention is in the form of a square plate and causing, at each side of the square plate, expanding and contracting vibration in a plane parallel to the square plate.

The vibrating device according to the second invention includes a Si layer made of a degenerate semiconductor, a silicon oxide layer, a piezoelectric layer, and first and second electrodes through which a voltage is applied to the piezoelectric layer. In the second invention, given that a total thickness of the Si layer is denoted by T1, a total thickness of the silicon oxide layer is denoted by T2, and the TCF in the vibrating device when the silicon oxide layer is not provided is denoted by x (ppm/K), T2/(T1+T2) is within a range of $(-0.0003x^2-0.0228x+0.0024)\pm0.05$.

A vibrating device according to a third invention is in the form of a rectangular plate having long sides and short sides when looked at in a plan view, and the vibrating device causes expanding and contracting vibration in a direction of the long sides.

The vibrating device according to the third invention includes a Si layer made of a degenerate semiconductor, a silicon oxide layer, a piezoelectric layer, and first and second electrodes through which a voltage is applied to the piezoelectric layer. In the third invention, given that a total thickness of the Si layer is denoted by T1, a total thickness of the silicon oxide layer is denoted by T2, and the TCF in the vibrating device when the silicon oxide layer is not provided is denoted by x (ppm/K), T2/(T1+T2) is within a range of $(-0.0003x^2-0.0250x+0.0215)\pm0.05$.

According to a specific aspect of the vibrating device of the present invention (the first to third inventions are collectively referred to as the present invention hereinafter), the Si layer is doped with an n-type dopant. Preferably, phosphorus (P) is used as the dopant.

According to another specific aspect of the vibrating device of the present invention, the silicon oxide layer is laminated on one principal surface of the Si layer.

According to still another specific aspect of the vibrating device of the present invention, the first electrode is disposed on one principal surface of the piezoelectric layer, and the second electrode is disposed on the other principal surface of the piezoelectric layer.

According to still another specific aspect of the vibrating device of the present invention, the Si layer serves also as the second electrode.

According to still another specific aspect of the vibrating device of the present invention, the silicon oxide layer is formed on each of both surfaces of the Si layer.

With the vibrating device according to the present invention, since the thickness ratio T2/(T1+T2) representing a proportion of the thickness of the silicon oxide layer is within the above-mentioned specific range, an absolute value of the temperature coefficient of resonant frequency (TCF) can be reduced greatly. Hence the vibrating device having satisfactory temperature characteristics can be provided.

DETAILED DESCRIPTION OF THE PREFERRED EMBODIMENTS

Practical embodiments of the present invention will be described below with reference to the drawings for clear understanding of the present invention.

Figure 1A:
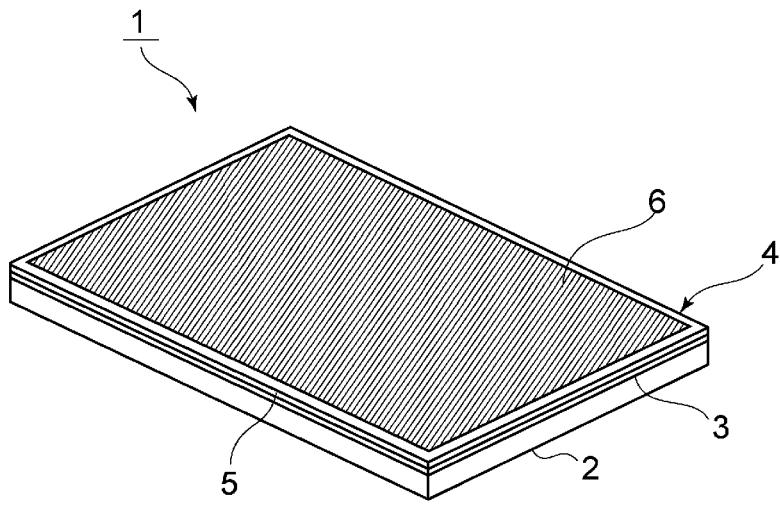
FIG. 1(a) is a perspective view of a vibrating device according to a first embodiment of the present invention.
Figure 1B:
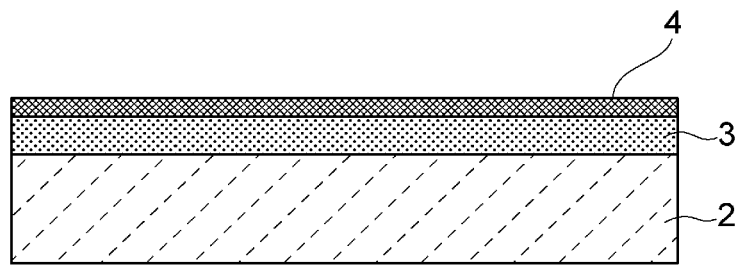
FIG. 1(b) is a front sectional view of the vibrating device.
Figure 1C:
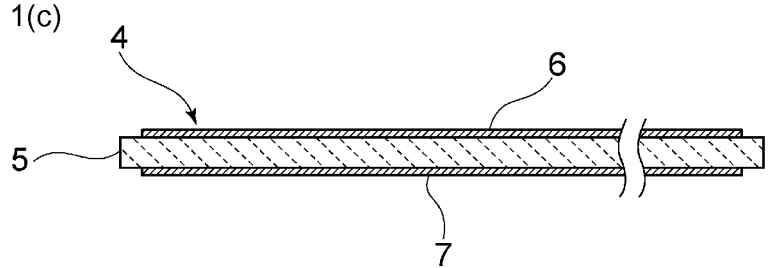
FIG. 1(c) is a front sectional view, partly cut-away, illustrating a sectional structure of an excitation portion used in the first embodiment.

FIG. 1(a) is a perspective view of a vibrating device according to a first embodiment of the present invention, FIG. 1(b) is a front sectional view of the vibrating device, and FIG. 1(c) is a front sectional view, partly cut-away, of an excitation portion used in the first embodiment.

The vibrating device 1 is in the form of a rectangular plate having a pair of long sides and a pair of short sides when looked at in a plan view. A silicon oxide layer 3 and an excitation portion 4 are laminated on a Si layer 2 in the form of a rectangular plate.

The Si layer 2 is made of a degenerate semiconductor. Because the Si layer is a degenerate semiconductor, the doping concentration of an n-type dopant therein needs to be $1 \times 10^{19}/cm^3$ or more. An example of the n-type dopant is a group 15 element, such as P, As or Sb. Preferably, P is used as the dopant. In that case, an n-type degenerate semiconductor can be manufactured easily.

Figure 10:
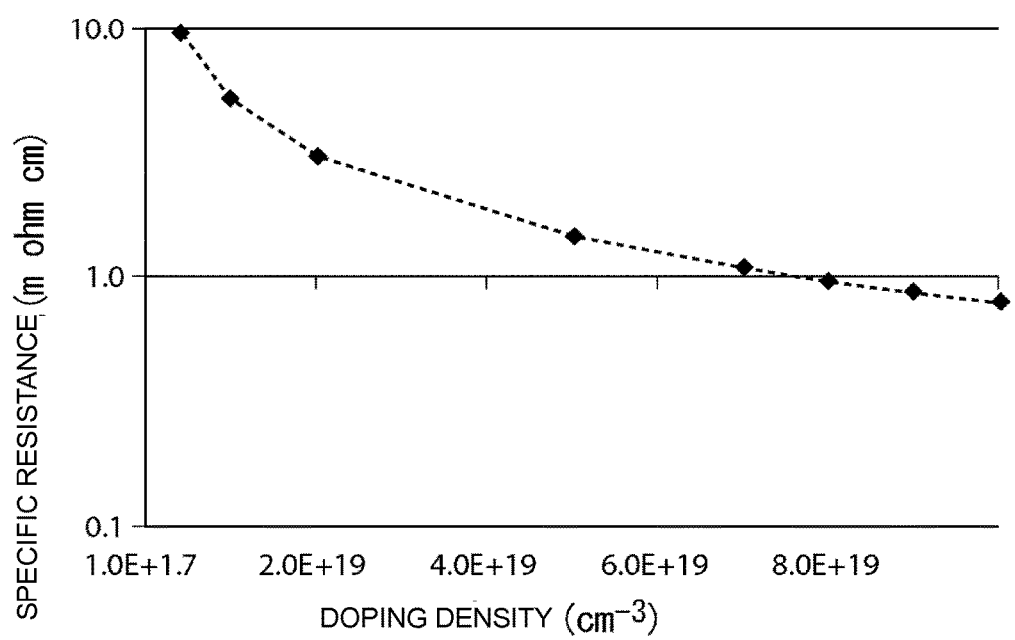
FIG. 10 is a graph depicting a relationship between a doping density of P in the Si layer and specific resistance of the Si layer.

In this embodiment, the Si layer is made of an n-type Si semiconductor in which phosphorous is doped at the concentration of $5 \times 10^{19}/cm^3$. Since the doping density of phosphorous (P) is $5 \times 10^{19}/cm^3$, the n-type Si semiconductor has specific resistance of 1.5 mΩ·cm or less as illustrated in FIG. 10, and hence it is a degenerate semiconductor.

The silicon oxide layer 3 is made of $SiO_2$ in this embodiment. Thus, in this embodiment, the silicon oxide layer 3 made of $SiO_2$ is laminated on an upper surface of the Si layer 2.

The silicon oxide layer 3 can be made of, without being limited to $SiO_2$, a silicon oxide-based material having a proper composition expressed by $Si_aO_b$ (a, b: integer).

In this embodiment, the excitation portion 4 includes a piezoelectric thin film 5 forming a piezoelectric layer, a first electrode 6, and a second electrode 7. The first electrode 6 and the second electrode 7 are disposed in a state sandwiching the piezoelectric thin film 5.

A piezoelectric material constituting the piezoelectric thin film 5 is not limited to particular one. In a vibrating device utilizing a bulk wave, however, a Q-value is preferably as high as possible. For that reason, AlN having a small electromechanical coupling coefficient $k^2$, but having a high Q-value is suitably used.

ZnO, Sc-substituted AlN, PZT, KNN, etc. may be used instead of AlN. In the case using a Sc-substituted AlN film (SLAlN), a Sc concentration is desirably about 0.5 at % to 50 at % on condition that an atomic concentration of Sc and Al is 100 at %.

ScAlN has a larger electromechanical coupling coefficient $k^2$ than AlN, and has larger mechanical Qm than PZT and KNN. Accordingly, when ScAlN is applied to a resonant vibrator as in the present invention, the following advantages can be obtained. An exemplary application of the resonant vibrator is an oscillator. In a TCXO (temperature compensated (crystal) oscillator), for example, a signal from a built-in temperature sensor is fed back to a variable capacitance element, which is connected in series to the vibrator, thereby changing a capacitance value of the variable capacitance element. As a result, an oscillation frequency can be adjusted. On that occasion, when ScAlN is used as the piezoelectric thin film instead of AlN, a specific band of the resonant vibrator is widened. Hence an adjustment range of the oscillation frequency can be widened.

Similarly, when ScAlN is used in a VCXO (voltage controlled oscillator), an adjustment range of the oscillation frequency is widened. Accordingly, initial frequency variations of the resonant vibrator can be adjusted by the variable capacitance element. Hence the cost of a frequency adjusting step can be reduced greatly.

The first and second electrodes 6 and 7 can be each formed by employing a proper metal, such as Mo, Ru, Pt, Ti, Cr, Al, Cu, Ag, or an alloy of those elements.

In the vibrating device 1 of this embodiment, the excitation portion 4 is excited by applying an alternating electric field between the first electrode 6 and the second electrode 7. As a result, the vibrating device 1 entirely causes vibration expanding and contracting in the direction of the short sides. Stated in another way, expanding and contracting vibration is caused in a way of repeating a state where the vibrating device 1 is expanding in the direction of the short sides, and a state where the vibrating device 1 is contracting in the direction of the short sides.

This embodiment is featured in that a thickness ratio of the silicon oxide layer 3 is set to fall within a specific range relative to a reference that is given as the TCF when the silicon oxide layer 3 is not provided. More specifically, it is here assumed the TCF resulting when the silicon oxide layer 3 is not provided is denoted by x (ppm/K). A value of the TCF when the silicon oxide layer 3 is not provided is determined depending on the doping amount in the Si layer 2 in which phosphorus (P) is doped. It is further assumed that the thickness of the Si layer 2 is denoted by T1, and the thickness of the silicon oxide layer 3 is denoted by T2. In this embodiment, a thickness ratio T2/(T1+T2) is set to fall within a range expressed by the following formula (1):

$$(-0.0003x^2-0.0256x+0.0008)\pm 0.05 \qquad \text{Formula (1)}$$

Under such a condition, an absolute value of the temperature coefficient of resonant frequency is greatly reduced to be kept within 0±5 ppm/° C. That point will be described below with reference to FIG. 2.

Figure 2:
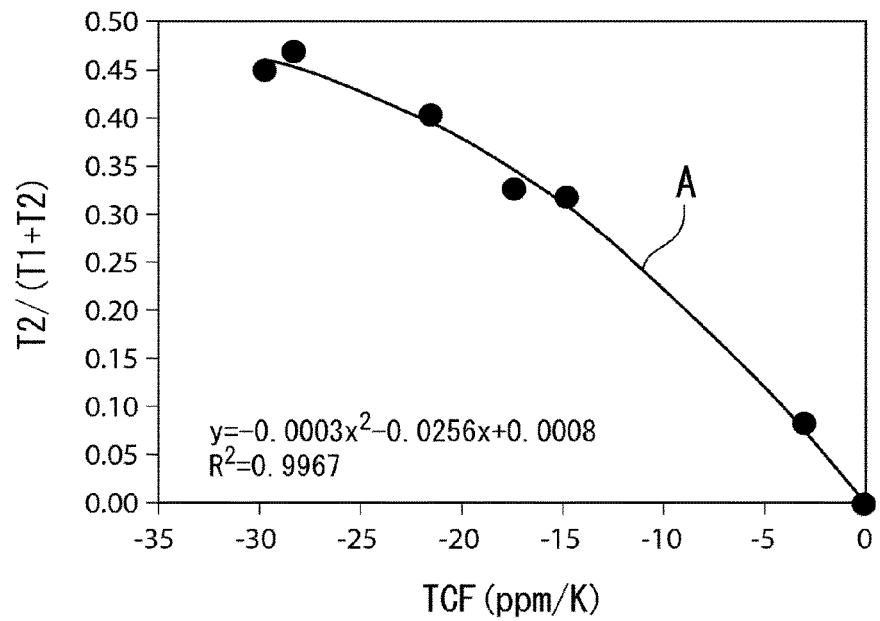
FIG. 2 is a graph to explain a thickness ratio T2/(T1+T2) at which an absolute value of the TCF becomes 0 in the first embodiment, assuming that the value of the TCF when a silicon oxide layer is not provided is denoted by x.

In FIG. 2, the horizontal axis represents the TCF when the silicon oxide layer is not provided as mentioned above, and the vertical axis represents the thickness ratio T2/(T1+T2). At points plotted in FIG. 2, the absolute value of the TCF is 0 in this embodiment in which the silicon oxide layer 3 is provided. A curve A is obtained with approximation on the basis of those points, and is expressed by $y=-0.0003x^2-0.0256x+0.0008$.

Accordingly, the TCF can be made 0 when the thickness ratio T2/(T1+T2) takes a value given by $-0.0003x^2-0.0256x+0.0008$. Furthermore, the inventors of this application have confirmed that, when the above-mentioned thickness ratio is within a range of $(-0.0003x^2-0.0256x+0.0008)\pm 0.05$, the TCF can be kept within a range of 0±5 ppm/° C.

It is hence understood that, in the first embodiment, it is possible to greatly reduce the absolute value of the temperature coefficient of resonant frequency (TCF), and to constitute the vibrating device 1 having satisfactory temperature characteristics by setting the thickness ratio T2/(T1+T2) so as to fall within the range expressed by the above-mentioned formula (1) corresponding to the TCF value that depends on the doping amount in the Si layer 2.

With the experiments conducted by the inventors of this application, the TCF of the above-described vibration characteristics was about −3 ppm/K on conditions of using the Si layer 2 to which phosphorus (P) was added at the concentration of $5\times 10^{19}/cm^3$ or more, and orienting the direction of the long sides of the above-mentioned rectangular shape to be aligned with the (100) direction of Si. In such a case, T2/(T1+T2)=0.08 is obtained from FIG. 2. Hence an optimum value of the thickness of the silicon oxide layer 3 is 0.8 μm.

Figure 3:
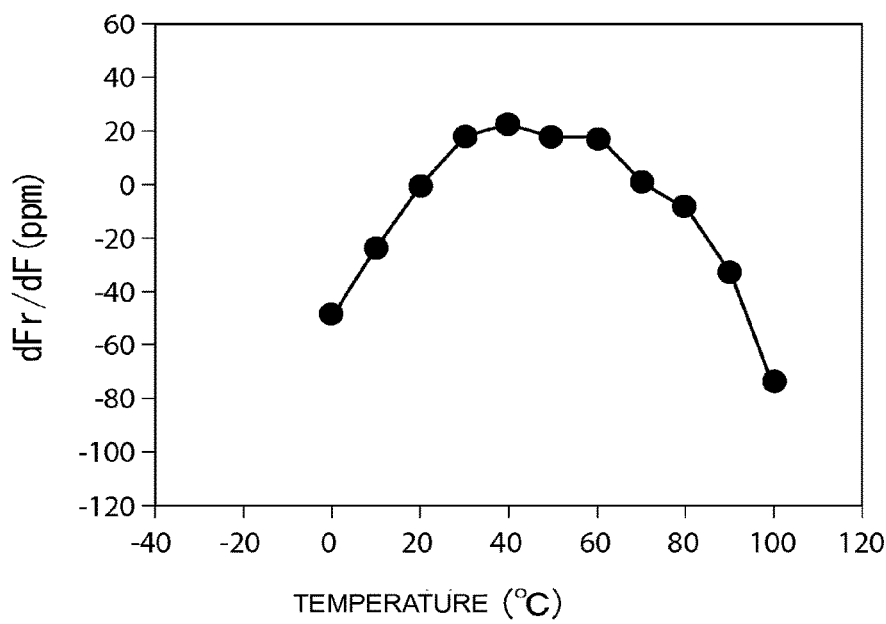
FIG. 3 is a graph depicting a relationship between a temperature and a resonant-frequency change rate in the vibrating device according to the first embodiment.

FIG. 3 depicts temperature change of a resonant-frequency change rate dFr/dF (ppm) in the vibrating device 1 of this embodiment. Here, dimensions of the vibrating device 1 are set to lengths of the long sides=210 μm and lengths of the short sides=140 μm. The doping amount of phosphorous (P) in the Si layer 2 is set to $5\times 10^{19}/cm^3$, and the thickness of the Si layer is set to 10 μm.

The silicon oxide layer 3 is made of $SiO_2$ and has a thickness of 0.8 μm. The piezoelectric thin film 5 in the excitation portion 4 is made of AlN and has a thickness of 0.8 μm. Each of the first and second electrodes 6 and 7 is made of Mo and has a thickness of 0.1 μm.

The vibrating device 1 having the resonant frequency of 26 MHz was fabricated under conditions described above.

A relationship between a resonant-frequency change rate dFr/dF (ppm) and a temperature in the above-described vibrating device 1 was determined with a resonant frequency $Fr_{20}$ at 20° C. being a reference. dFr/dF is expressed by $(Fr-Fr_{20})/Fr_{20}$.

According to this embodiment, as seen from FIG. 3, the resonant-frequency change rate is very small, i.e., within 80 ppm, between 0 and 100° C.

Figure 4A:
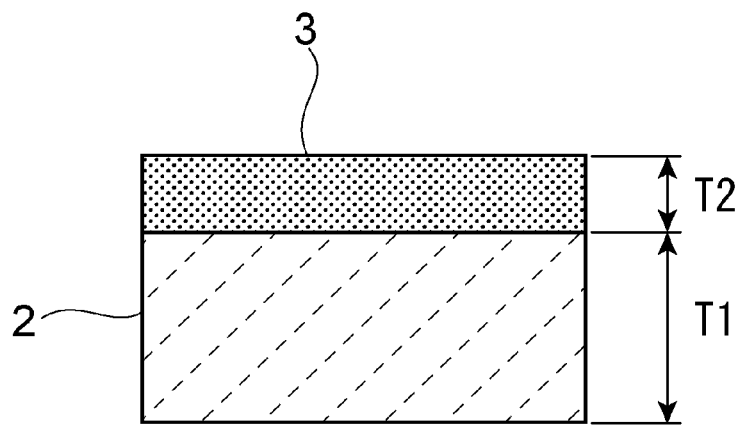
FIGS. 4(a) and 4(b) are front sectional views illustrating respectively, in the present invention, a structure in which the silicon oxide layer is laminated on a Si layer, and a structure in which the silicon oxide layer is laminated on each of both surfaces of the Si layer.
Figure 4B:
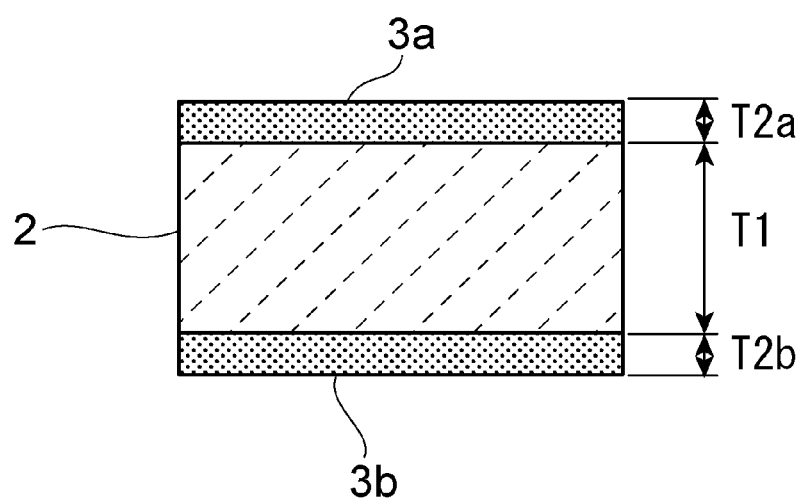

In the above-described embodiment, as schematically illustrated in FIG. 4(a), the silicon oxide layer 3 is laminated on one surface of the Si layer 2. In the present invention, however, as illustrated in FIG. 4(b), one silicon oxide layer 3a may be laminated on one surface of the Si layer 2, and the other silicon oxide layer 3b may be laminated on the other surface of the Si layer 2. In such a case, T2 in the above-described thickness ratio T2/(T1+T2) can be given by a total of respective thicknesses T2a and T2b of the plural silicon oxide layers 3a and 3b. Similarly, the Si layer may also be formed by laminating a plurality of layers. In such a case, the thickness T1 can be given as a total of respective thicknesses of the plural Si layers.

In the structure in which the silicon oxide layers 3a and 3b are provided on both the surfaces of the Si layer 2, warping of the Si layer can be suppressed.

Figure 11A:
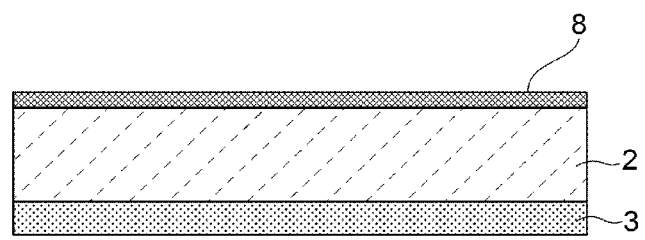
FIG. 11(a) is a front sectional view of a vibrating device according to a modification of the first embodiment of the present invention.
Figure 11B:
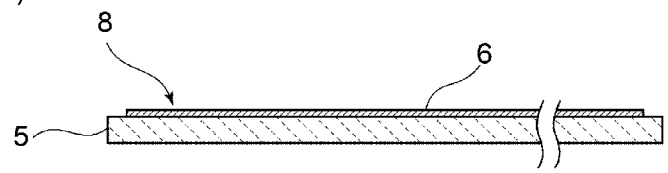
FIG. 11(b) is a front sectional view, partly cut-away, of an excitation portion used in the vibrating device according to the modification.

FIG. 11(a) is a front sectional view of a vibrating device according to a modification of the first embodiment of the present invention. FIG. 11(b) is a front sectional view, partly cut-away, of an excitation portion used in the vibrating device according to the modification.

In the vibrating device according to the modification of the first embodiment, as illustrated in FIG. 11(a), the silicon oxide layer 3 is laminated on one principal surface of the Si layer 2. An excitation portion 8 is laminated on the other principal surface of the Si layer 2. The excitation portion 8 includes the piezoelectric thin film 5 and the first electrode 6. In this modification, the second electrode 7 is not separately provided, and the Si layer 2 serves also as the second electrode.

The piezoelectric thin film 5 and the first electrode 6 are laminated on the Si layer 2 in the mentioned order. Because of the Si layer 2 being made of a degenerative semiconductor, when the Si layer 2, the piezoelectric thin film 5, and the first electrode 6 are laminated in the mentioned order, the Si layer 2 acts as the second electrode. Thus, in this modification, a voltage is applied to the piezoelectric thin film 5 through the first electrode 6 and the Si layer 2. Since there is no necessity of separately providing the second electrode 7, the structure can be simplified in this modification. Hence the vibrating device having good reliability and high mass-productivity can be provided.

Figure 11C:
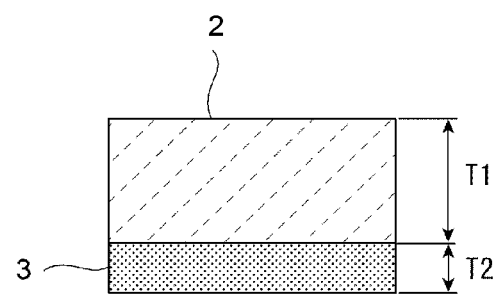
FIG. 11(c) is a front sectional view of a structure in which the silicon oxide layer is laminated on the Si layer in the modification of the first embodiment.

Also in this modification of the first embodiment, assuming that the thickness of the Si layer 2 is denoted by T1 and the thickness of the silicon oxide layer 3 is denoted by T2 as illustrated in FIG. 11(c), and that the TCF in the vibrating device when the silicon oxide layer is not provided is denoted by x (ppm/K), the thickness ratio T2/(T1+T2) is set to fall within the range expressed by the following formula (1):

$$(-0.0003x^2-0.0256x+0.0008)\pm 0.05 \qquad \text{Formula (1)}$$

Under such a condition, the absolute value of the temperature coefficient of resonant frequency can be greatly reduced and kept within 0±5 ppm/° C. Hence the vibrating device having satisfactory temperature characteristics can be provided.

Figure 5:
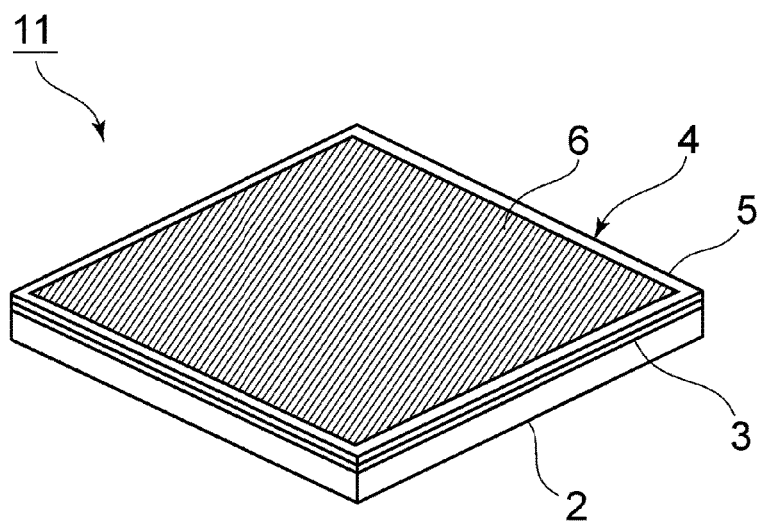
FIG. 5 is a perspective view of a vibrating device according to a second embodiment of the present invention.

FIG. 5 is a perspective view of a vibrating device according to a second embodiment of the present invention. The vibrating device 11 of the second embodiment is entirely in the form of a square plate. Also in the second embodiment, the silicon oxide layer 3 and the excitation portion 4 are laminated on the Si layer 2.

The vibrating device 11 of the second embodiment is the same as that of the first embodiment except for the plan shapes of the Si layer 2, the silicon oxide layer 3, and the excitation portion 4. Therefore, the same parts are denoted by the same reference numerals, and detailed description of those parts is omitted on an assumption that the above description of the first embodiment is involved here by reference.

In this embodiment, the vibrating device 11 is in the form of a square shape. When an alternating electric field is applied between the first electrode 6 and the second electrode 7 in the excitation portion 4, the square plate causes expanding and contracting vibration in a plane parallel to both principal surfaces of the square plate. In other words, vibration characteristics in the expanding and contracting vibration mode can be utilized.

Also in this embodiment, since the thickness ratio T2/(T1+T2) of the thickness T2 of the silicon oxide layer 3 is set to fall within a specific range, the absolute value of the temperature coefficient of resonant frequency (TCF) can be reduced greatly. More specifically, the thickness ratio T2/(T1+T2) is set to fall within a range of $(-0.0003x^2-0.0228x+0.0024)\pm0.05$. Under such a condition, the absolute value of the temperature coefficient of resonant frequency (TCF) can be held within a range of 0±5 ppm/° C. That point will be described below with reference to FIG. 6.

Figure 6:
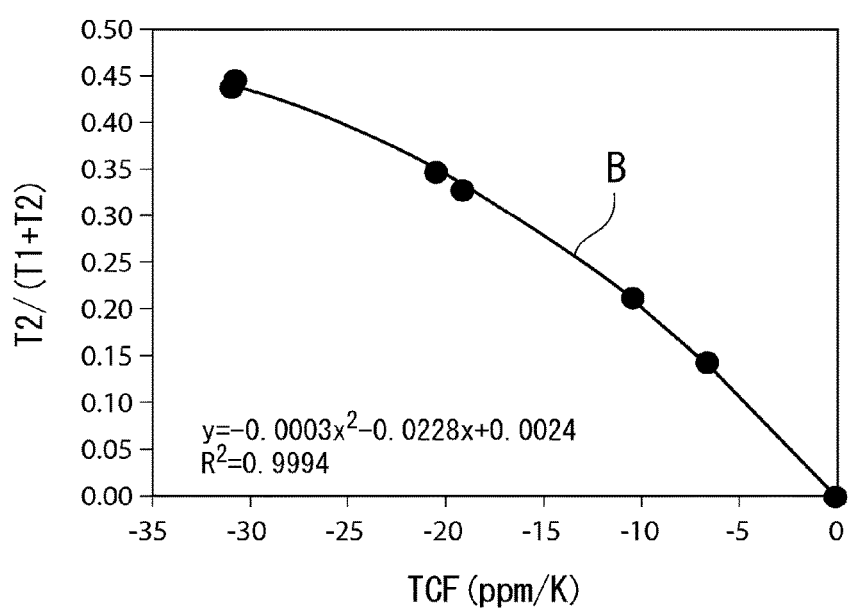
FIG. 6 is a graph to explain the thickness ratio T2/(T1+T2) at which an absolute value of the TCF becomes 0 in the second embodiment, assuming that the value of the TCF when the silicon oxide layer is not provided is denoted by x.

In FIG. 6, the horizontal axis represents the TCF when the silicon oxide layer is not provided, and the vertical axis represents the thickness ratio T2/(T1+T2). Many points plotted in FIG. 6 correspond to positions at which the temperature coefficient of resonant frequency (TCF) becomes 0 when the silicon oxide layer is provided. A curve B is obtained with approximation on the basis of respective coordinates of those points, and is expressed by $y=-0.0003x^2-0.0228x+0.0024$ where y denotes the thickness ratio and x denotes the TCF represented by the horizontal axis. Accordingly, the temperature coefficient of resonant frequency (TCF) can be made 0 by selecting the thickness ratio T2/(T1+T2) so as to satisfy the above formula depending on the value x of the TCF when the silicon oxide layer 3 is not provided. Furthermore, the experiments conducted by the inventors of this application have proved that, when the above-mentioned thickness ratio is within the range of $(-0.0003x^2-0.0228x+0.0024)\pm0.05$, the temperature coefficient of resonant frequency (TCF) can be kept within a range of 0±5 ppm/° C.

Thus, in the second embodiment, it is also possible to greatly reduce the temperature coefficient of resonant frequency (TCF) by selecting the thickness ratio T2/(T1+T2) depending on the value X of the TCF, which value is determined depending on the doping amount in the Si layer.

Figure 7:
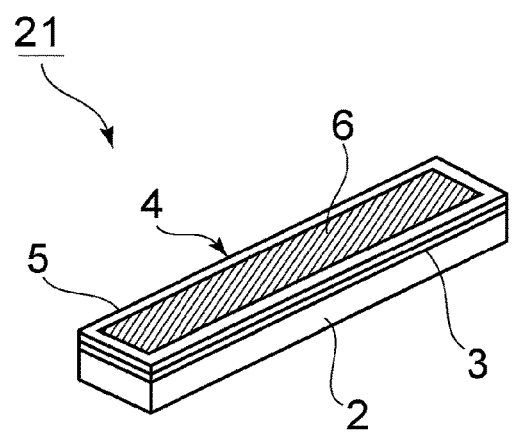
FIG. 7 is a perspective view of a vibrating device according to a third embodiment of the present invention.

FIG. 7 is a perspective view of a vibrating device according to a third embodiment of the present invention. The vibrating device 21 of the third embodiment has a structure in which the Si layer 2, the silicon oxide layer 3, and the excitation portion 4 are laminated, as in the first and second embodiments. The third embodiment is different in that the vibrating device is entirely in the form of an elongate plate, i.e., in the form of a strip, and that a vibration mode expanding and contracting in the lengthwise direction of the elongate plate is utilized. The vibrating device 21 of the third embodiment is the same as that of the first embodiment except for the plan shapes of the Si layer 2, the silicon oxide layer 3, and the excitation portion 4. Therefore, detailed description of individual parts is omitted on an assumption that the above description of the first embodiment is involved here by reference.

In this embodiment, when an alternating electric field is applied between the first electrode 6 and the second electrode 7, the vibrating device 21 is caused to expand and contract in the lengthwise direction. The third embodiment is featured, as in the first and second embodiments, in that the thickness ratio T2/(T1+T2) of the silicon oxide layer 3 is set to fall within a range of $(-0.0003x^2-0.0250x+0.0215)\pm0.05$ on the basis of a value x of the TCF when the silicon oxide layer 3 is not provided. Under such a condition, the absolute value of the temperature coefficient of resonant frequency (TCF) can be reduced. That point will be described below with reference to FIG. 8.

Figure 8:
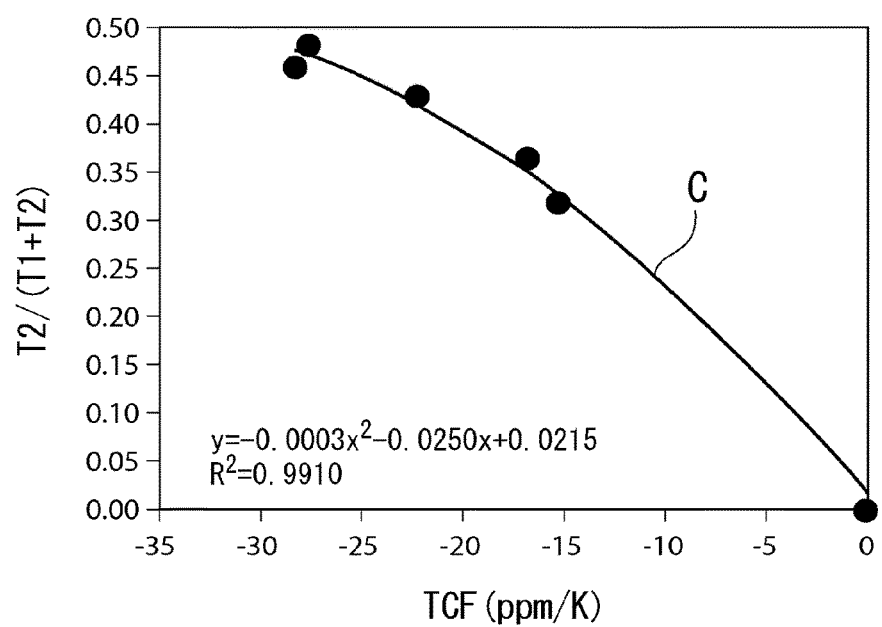
FIG. 8 is a graph to explain the thickness ratio T2/(T1+T2) at which an absolute value of the TCF becomes 0 in the third embodiment, assuming that the value of the TCF when the silicon oxide layer is not provided is denoted by x.

In FIG. 8, the horizontal axis represents the TCF when the silicon oxide layer 3 is not provided, and the vertical axis represents the thickness ratio T2/(T1+T2). At many points plotted in FIG. 8, the temperature coefficient of resonant frequency (TCF) becomes 0 in this embodiment in which the silicon oxide layer is provided. A curve C is obtained with approximation on the basis of respective coordinates of those points, and is expressed by $y=-0.0003x^2-0.0250x+0.0215$.

Accordingly, the temperature coefficient of resonant frequency TCF can be made 0 by setting the thickness ratio T2/(T1+T2) so as to satisfy the above-described formula. Furthermore, the experiments conducted by the inventors of this application have proved that, when the thickness ratio T2/(T1+T2) is within the range of $(-0.0003x^2-0.0250x+0.0215)\pm0.05$, the temperature coefficient of resonant frequency (TCF) can be kept within a range of 0±5 ppm/° C.

Thus, the thickness ratio T2/(T1+T2) may be set to fall within the range of $(-0.0003x^2-0.0250x+0.0215)\pm0.05$ depending on the value x that is determined depending on the doping amount in the Si layer. As a result, the absolute value of the temperature coefficient of resonant frequency (TCF) can be reduced greatly.

Figure 9:
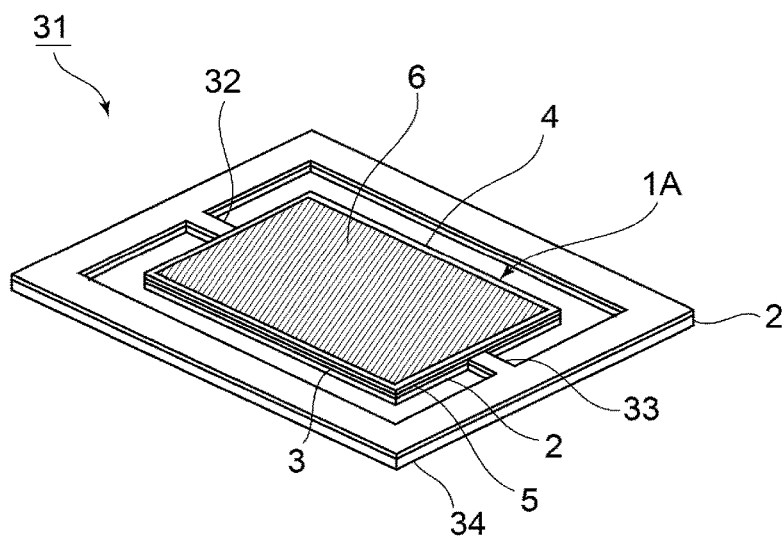
FIG. 9 is a perspective view of a vibrating device according to a fourth embodiment of the present invention.

FIG. 9 is a perspective view of a vibrating device according to a fourth embodiment of the present invention. The vibrating device 31 of the fourth embodiment includes a vibrating portion 1A that is constituted similarly to the first embodiment. Individual parts of the vibrating portion 1A are the same as those in the vibrating device 1 of the first embodiment. Therefore, the individual parts are denoted by the same reference numerals, and description of those parts is omitted. In the vibrating device 31 of this embodiment, respective one ends of coupling portions 32 and 33 are coupled to respective centers of short sides of the vibrating portion 1A. The respective other ends of the coupling portions 32 and 33 are coupled to a support 34 in the form of a rectangular frame. Each of the coupling portions 32 and 33 and the support 34 has a structure in which the Si layer 2 and the silicon oxide layer 3 are laminated, as in the vibrating portion 1A. The coupling portions 32 and 33 are coupled to respective centers of short-side lateral surfaces of the vibrating portion 1A. The centers of the short-side lateral surfaces of the vibrating portion 1A serve as vibration nodes of expanding and contracting vibration of the vibrating portion 1A. Accordingly, the vibrating portion 1A can be supported by the support 34 and the coupling portions 32 and 33 in a manner not interfering with the vibration of the vibrating portion 1A.

Also in this embodiment, since the vibrating portion 1A is constituted similarly to that in the vibrating device 1, the absolute value of the temperature coefficient of resonant frequency (TCF) can be reduced greatly as in the first embodiment.

As seen from the fourth embodiment, in the vibrating device according to the present invention, the thickness ratio T2/(T1+T2) of the silicon oxide layer is just required to be set to fall within the above-described formula. In other words, a support structure is not limited to particular one. Also in each of the second and third embodiments, coupling portions may be coupled to and supported at nodes of the vibration in the corresponding vibrating device.

REFERENCE SIGNS LIST

1 . . . vibrating device
1A . . . vibrating portion
2 . . . Si layer
3, 3a, 3b . . . silicon oxide layers
4, 8 . . . excitation portions
5 . . . piezoelectric thin film
6, 7 . . . first and second electrodes
11, 21, 31 . . . vibrating devices
32, 33 . . . coupling portions
34 . . . support

The invention claimed is:

1. A vibrating device comprising:
a rectangular body having opposed long sides and opposed short sides, and configured to exhibit expanding and contracting vibration in a direction of the short sides,
wherein the rectangular body includes:
a Si layer made of a degenerate semiconductor;
a silicon oxide layer;
a piezoelectric layer; and
first and second electrodes through which a voltage is applied to the piezoelectric layer, and
wherein when a total thickness of the Si layer is denoted by T1, a total thickness of the silicon oxide layer is denoted by T2, and a temperature coefficient of resonant frequency in the vibrating device when the silicon oxide layer is not provided is denoted by x, T2/(T1+T2) is within a range of $(-0.0003x^2-0.0256x+0.0008)$ ±0.05.

2. The vibrating device according to claim 1, wherein the Si layer is doped with an n-type dopant.

3. The vibrating device according to claim 2, wherein the dopant is phosphorus.

4. The vibrating device according to claim 1, wherein the silicon oxide layer is on a first principal surface of the Si layer.

5. The vibrating device according to claim 1, wherein the first electrode is disposed on a first principal surface of the piezoelectric layer, and the second electrode is disposed on a second principal surface of the piezoelectric layer opposite to the first principal surface.

6. The vibrating device according to claim 1, wherein the Si layer is also the second electrode.

7. The vibrating device according to claim 4, wherein the silicon oxide layer is a first silicon oxide layer, and the vibrating device further comprises a second silicon oxide layer on a second principal surface of the Si layer opposite the first principal surface.

8. A vibrating device comprising:
a square body configured to exhibit expanding and contracting vibration in a plane parallel to the square body,
wherein the vibrating device includes:
a Si layer made of a degenerate semiconductor;
a silicon oxide layer;
a piezoelectric layer; and
first and second electrodes through which a voltage is applied to the piezoelectric layer, and
wherein when a total thickness of the Si layer is denoted by T1, a total thickness of the silicon oxide layer is denoted by T2, and a temperature coefficient of resonant frequency in the vibrating device when the silicon oxide layer is not provided is denoted by x, T2/(T1+T2) is within a range of $(-0.0003x^2-0.0228x+0.0024)$ ±0.05.

9. The vibrating device according to claim 8, wherein the Si layer is doped with an n-type dopant.

10. The vibrating device according to claim 9, wherein the dopant is phosphorus.

11. The vibrating device according to claim 8, wherein the silicon oxide layer is on a first principal surface of the Si layer.

12. The vibrating device according to claim 8, wherein the first electrode is disposed on a first principal surface of the piezoelectric layer, and the second electrode is disposed on a second principal surface of the piezoelectric layer opposite to the first principal surface.

13. The vibrating device according to claim 8, wherein the Si layer is also the second electrode.

14. The vibrating device according to claim 11, wherein the silicon oxide layer is a first silicon oxide layer, and the vibrating device further comprises a second silicon oxide layer on a second principal surface of the Si layer opposite the first principal surface.

15. A vibrating device comprising:
a rectangular body having opposed long sides and opposed short sides, and configured to exhibit expanding and contracting vibration in a direction of the long sides,
wherein the vibrating device includes:
a Si layer made of a degenerate semiconductor;
a silicon oxide layer;
a piezoelectric layer; and
first and second electrodes through which a voltage is applied to the piezoelectric layer, and
wherein when a total thickness of the Si layer is denoted by T1, a total thickness of the silicon oxide layer is denoted by T2, and a temperature coefficient of resonant frequency in the vibrating device when the silicon oxide layer is not provided is denoted by x, T2/(T1+T2) is within a range of $(-0.0003x^2-0.0250x+0.0215)$ ±0.05.

16. The vibrating device according to claim 15, wherein the Si layer is doped with an n-type dopant.

17. The vibrating device according to claim 16, wherein the dopant is phosphorus.

18. The vibrating device according to claim 15, wherein the silicon oxide layer is on a first principal surface of the Si layer.

19. The vibrating device according to claim 15, wherein the first electrode is disposed on a first principal surface of the piezoelectric layer, and the second electrode is disposed on a second principal surface of the piezoelectric layer opposite the first principal surface.

20. The vibrating device according to claim 15, wherein the Si layer is also the second electrode.

* * * * *